(12) United States Patent
Hsu

(10) Patent No.: US 9,372,205 B2
(45) Date of Patent: Jun. 21, 2016

(54) UNIVERSAL PROBE CARD PCB DESIGN

(71) Applicant: Taiwan Semiconductor Manufacturing CO., LTD., Hsinchu (TW)

(72) Inventor: Ming-Cheng Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 51 days.

(21) Appl. No.: 14/155,699

(22) Filed: Jan. 15, 2014

(65) Prior Publication Data
US 2015/0198631 A1    Jul. 16, 2015

(51) Int. Cl.
*G01R 1/04* (2006.01)
*G01R 1/073* (2006.01)
*G01R 31/26* (2014.01)

(52) U.S. Cl.
CPC .......... *G01R 1/0408* (2013.01); *G01R 31/2601* (2013.01)

(58) Field of Classification Search
None
See application file for complete search history.

(56) References Cited

U.S. PATENT DOCUMENTS

| | | | | |
|---|---|---|---|---|
| 5,384,433 A * | 1/1995 | Osann, Jr. | ............ | H05K 1/0287 174/250 |
| 5,469,072 A * | 11/1995 | Williams | ............. | G01R 1/0735 324/72.5 |
| 5,838,159 A | 11/1998 | Johnson | | |
| 6,388,890 B1 * | 5/2002 | Kwong | .................. | H05K 1/112 174/255 |
| 6,686,666 B2 * | 2/2004 | Bodas | ................. | G06F 17/5068 257/693 |
| 6,720,501 B1 * | 4/2004 | Henson | .................. | H05K 1/115 174/261 |
| 6,762,366 B1 * | 7/2004 | Miller | ............... | H01L 23/49838 174/250 |
| 6,817,870 B1 * | 11/2004 | Kwong | .................. | H05K 3/368 409/66 |
| 6,872,595 B1 * | 3/2005 | Kwong | .................... | H05K 1/14 29/830 |
| 6,936,502 B2 * | 8/2005 | Wyrzykowska | ....... | H05K 1/112 29/835 |
| 6,967,556 B2 * | 11/2005 | Gaschke | ............ | G01R 1/07378 336/200 |
| 6,996,899 B2 * | 2/2006 | Searls | ............... | H01L 23/49838 228/180.21 |
| 7,051,434 B2 * | 5/2006 | Miller | ............... | H01L 23/49838 174/255 |
| 7,061,117 B2 * | 6/2006 | Yang | ....................... | H01L 23/50 257/773 |
| 7,069,646 B2 * | 7/2006 | Duxbury | ................ | H05K 1/115 174/261 |
| 7,071,715 B2 * | 7/2006 | Shinde | ............... | G01R 1/07378 324/756.03 |

(Continued)

FOREIGN PATENT DOCUMENTS

JP    2009244213    10/2009

*Primary Examiner* — Jermele M Hollington
*Assistant Examiner* — Suresh K Rajaputra

(57) ABSTRACT

A printed circuit board (PCB) is disclosed. The PCB includes a plurality of first signal pads, a plurality of signal channels, and a plurality of second signal pads. The first signal pads are adjacently disposed to define an opening. At least one of the first signal pads is configured to be electrically connected to at least one of signal traces of a membrane core inserted into the opening. All of the signal channels are electrically connected to all of the first signal pads respectively. All of the second signal pads are electrically connected to all of the signal channels respectively.

20 Claims, 3 Drawing Sheets

(56) References Cited

U.S. PATENT DOCUMENTS

| | | | | |
|---|---|---|---|---|
| 7,107,673 | B2 * | 9/2006 | Kwong | H05K 1/0231 29/830 |
| 7,196,531 | B2 * | 3/2007 | Grube | G01R 1/07314 324/756.03 |
| 7,256,354 | B2 * | 8/2007 | Wyrzykowska | H05K 1/112 174/255 |
| 7,259,336 | B2 * | 8/2007 | Wyrzykowska | H05K 1/112 174/250 |
| 7,281,326 | B1 * | 10/2007 | Kwong | H05K 1/181 174/255 |
| 7,307,427 | B2 * | 12/2007 | Jacobsen | G01R 31/2853 324/519 |
| 7,459,795 | B2 * | 12/2008 | Eldridge | G01R 1/07342 257/785 |
| 7,583,513 | B2 * | 9/2009 | Boggs | H05K 1/0268 174/264 |
| 7,688,086 | B2 * | 3/2010 | Motoyama | G01R 1/07314 324/754.07 |
| 7,725,860 | B1 * | 5/2010 | Kwong | H05K 3/0005 29/846 |
| 7,757,196 | B2 * | 7/2010 | Bird | H05K 1/113 716/125 |
| 7,776,626 | B2 * | 8/2010 | Hasebe | G01R 31/2889 257/48 |
| 7,838,778 | B1 * | 11/2010 | Hasko | H05K 1/114 174/262 |
| 7,876,087 | B2 * | 1/2011 | Mok | C23C 26/00 324/750.3 |
| 7,979,983 | B2 * | 7/2011 | Bird | H05K 1/113 174/262 |
| 8,103,988 | B2 * | 1/2012 | Pfeil | G06F 17/5068 716/100 |
| 8,248,091 | B2 * | 8/2012 | Cheng | G01R 1/07371 324/754.07 |
| 8,344,266 | B2 * | 1/2013 | Bird | H05K 1/113 174/260 |
| 8,357,933 | B2 * | 1/2013 | Hasebe | G01R 31/2889 257/48 |
| 8,472,202 | B1 * | 6/2013 | Clewell | H05K 1/0222 361/748 |
| 8,531,202 | B2 * | 9/2013 | Mok | G01R 31/2889 324/762.03 |
| 8,614,590 | B2 * | 12/2013 | Miller | G01R 1/07314 324/754.01 |
| 8,885,357 | B2 * | 11/2014 | Kim | H05K 1/0222 174/262 |
| 8,990,754 | B2 * | 3/2015 | Bird | H05K 1/113 716/122 |
| 2005/0093565 | A1 * | 5/2005 | Okamoto | G01R 1/07307 438/14 |
| 2006/0065433 | A1 * | 3/2006 | Danoski | H01L 23/66 174/255 |
| 2008/0082950 | A1 * | 4/2008 | Mathews | G06F 17/5068 716/50 |
| 2009/0224780 | A1 | 9/2009 | Chao et al. | |
| 2011/0291978 | A1 * | 12/2011 | Ho | G06F 3/045 345/173 |
| 2014/0002935 | A1 * | 1/2014 | Chen | H05K 1/0245 361/56 |

* cited by examiner

UNIVERSAL PROBE CARD PCB DESIGN

BACKGROUND

In integrated circuit (IC) manufacturing, testing is a key step to ensure the functionality of a device.

Typically, in a testing procedure, a tester is configured to generate testing signals. The tester is coupled to a prober. The prober includes a probe head. The prober is configured to provide the testing signals for a device-under-test (DUT) via the probe head and a probe card. The probe card includes needle tips configured to contact with contact points on the DUT. The probe card is designed corresponding to a specific IC design of the DUT. Through the probe card, the tester is able to test different DUTs with different designs by using a common, and often quite expensive, probe head.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
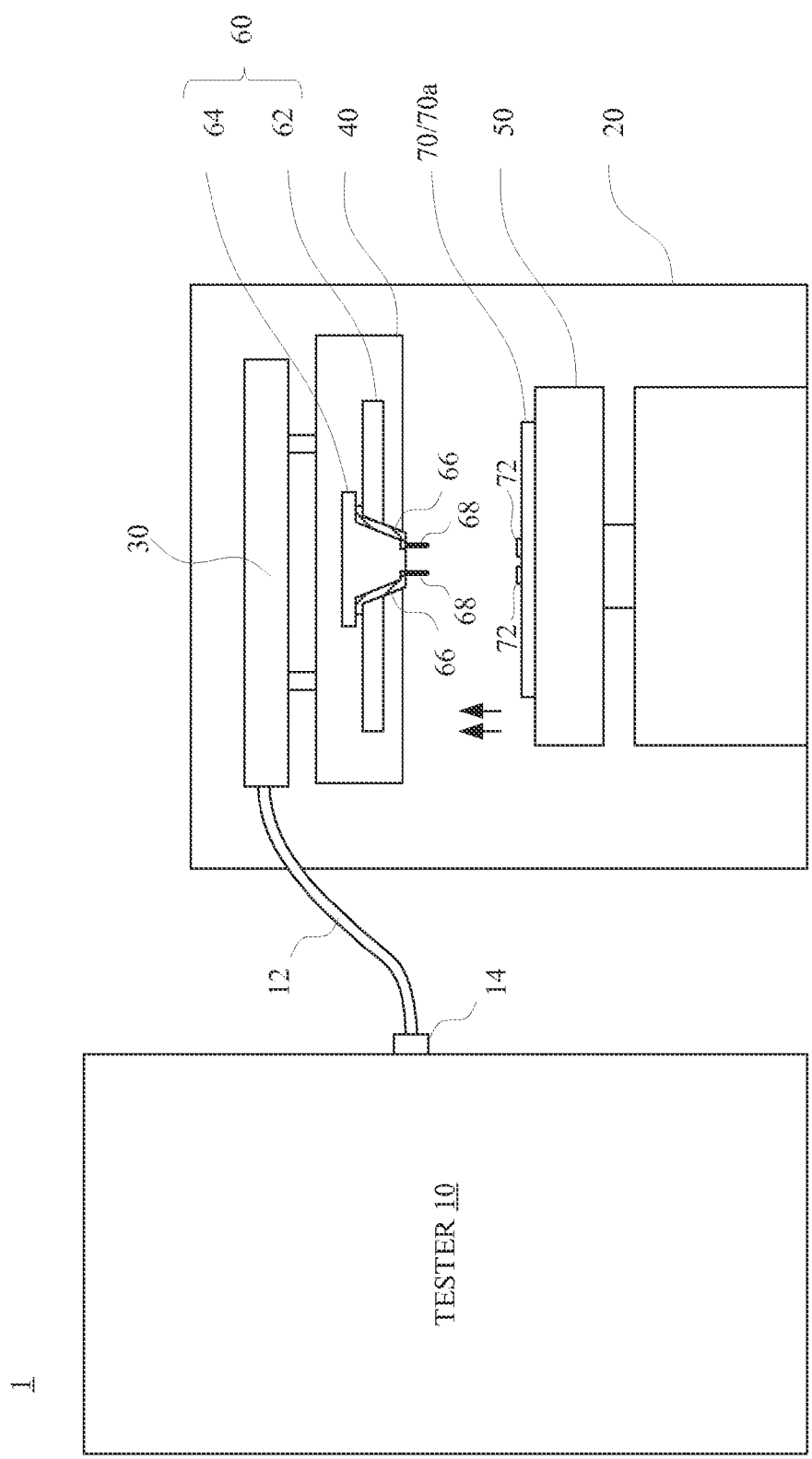
FIG. 1 is a schematic diagram of a testing system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., are used herein to describe various elements, these elements should not be limited by these terms. These terms are used to distinguish one element from another. For example, a first element could be termed a second element, and, similarly, a second element could be termed a first element, without departing from the scope of the embodiments.

As used herein, the terms "comprising," "including," "having," "containing," "involving," and the like are to be open-ended, i.e., to mean including but not limited to.

In this document, the term "coupled" is termed as "electrically coupled", and the term "connected" is termed as "electrically connected". "coupled" and "connected" are also used to indicate that two or more elements cooperate or interact with each other.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is a schematic diagram of a testing system 1, in accordance with some embodiments. The testing system 1 includes a tester 10 and a prober 20. The tester 10 includes a testing signal output port 14. The testing signal output port 14 includes testing signal output ends (not shown). The tester 10 and the prober 20 are connected through a cable 12 and the testing signal output ends of the test signal output port 14. The tester 10 is configured to generate testing signals, and transmit the testing signals to the prober 20 via the cable 12 and the testing signal output ends of the test signal output port 14. A device-under-test (DUT) 70/70a is placed in the prober 20. The prober 20 is configured to provide the testing signals to the DUT 70/70a placed therein. In some embodiments, the DUT 70/70a is a wafer. In some embodiments, the tester 10 is an Agilent MPTT (massive parallel parametric tester) tester for a wafer acceptable test (WAT).

In some embodiments, the prober 20 includes a test head 30, an interface 40, and a chuck 50. The test head 30 is electrically connected between the cable 12 and the interface 40. The interface 40 is electrically connected to a probe card 60. The chuck 50 is configured to enable the DUT 70/70a to be mounted thereon. The test head 30 is configured to receive the testing signals from the cable 12, and to transmit the testing signals to the probe card 60 via the interface 40. In some embodiments, the interface 40 is a printed circuit board (PCB) adapter.

In some embodiments, the probe card 60 includes a PCB 62 and a membrane core 64. The PCB 62 is configured to be electrically connected between the interface 40 and the membrane core 64. The membrane core 64 includes signal traces 66 and needle pins 68. The signal traces 66 are configured to electrically connect the PCB 62 to the needle pins 68. The needle pins 68 are configured to contact with contact pads 72 of the DUT 70/70a, so as to probe the DUT 70/70a.

For illustration, in an operation, the DUT 70/70a is mounted on the chuck 50. The chuck 50 lifts the DUT 70/70a, such that the needle pins 68 of the probe card 60 make contacts with the contact pads 72 of the DUT 70/70a. Through such a configuration, the testing signals are able to be provided to the DUT 70/70a via the test head 30, the interface 40, the PCB 62, the signal traces 66, and the needle tips 68, so as to test the functionality of the DUT 70/70a.

Figure 2:
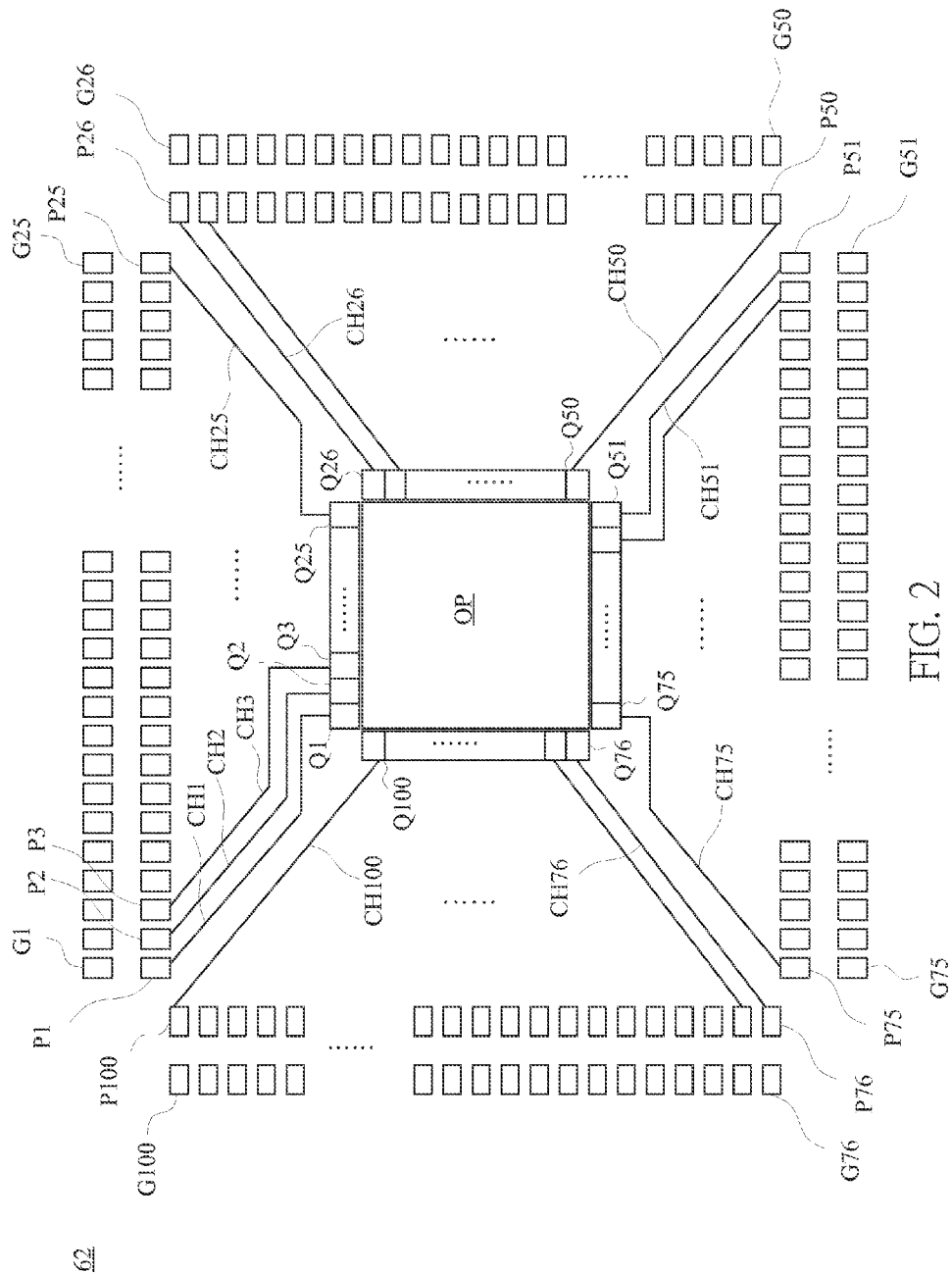
FIG. 2 is a top view of a printed circuit board (PCB) of a probe card, in accordance with some embodiments.

Reference is also made to FIG. 2, which is a top view of the PCB 62, in accordance with some embodiments. In these embodiments, the PCB 62 includes signal pads P1-P100, signal pads Q1-Q100, signal channels CH1-CH100, and ground pads G1-G100.

The signal pads P1-P100, signal pads Q1-Q100, signal channels CH1-CH100, and ground pads G1-G100 in FIG. 2 and the following embodiments are given for illustrative purposes. Various numbers and configurations of the signal pads P1-P100, signal pads Q1-Q100, signal channels CH1-CH100, and ground pads G1-G100 are within the contemplated scope of the present disclosure.

As shown in FIG. 2, the signal pads Q1-Q100 are adjacently disposed to define an opening OP. In some embodiments, the signal pads Q1-Q100 are clustered into four pad assemblies Q1-Q25, Q26-Q50, Q51-Q75, Q76-Q100. The four pad assemblies Q1-Q25, Q26-Q50, Q51-Q75, Q76-Q100 are arranged to form a rectangle, and the opening OP has a rectangular shape correspondingly. In various embodiments, the signal pads Q1-Q100 are arranged to form a circle or a diamond, and the opening OP has a circle shape or a diamond shape correspondingly.

The shapes of the opening OP described above are given for illustrative purposes. Various shapes of the opening OP are within the contemplated scope of the present disclosure.

In some embodiments, the opening OP is configured to be inserted by the membrane core 64. The signal pads Q1-Q100 are configured to be electrically connected to the signal traces 66 and needle pins 68 of the membrane core 64. In some embodiments, the signal pads Q1-Q100 contact with golden fingers (not shown) disposed on the signal traces 66.

In some embodiments, all of the signal pads Q1-Q100 are electrically connected to the signal channels CH1-CH100 respectively. In addition, all of the signal channels CH1-CH100 are electrically connected to all of the signal pads P1-P100 respectively. In other words, all of the signal pads Q1-Q100 are electrically connected, in a 1-to-1 way, to all the signal pads P1-P100 via the signal channels CH1-CH100. For illustration, the signal pad Q1 is electrically connected to the signal pad P1 through the signal channel CH1, the signal pad Q2 is electrically connected to the signal pad P2 through the signal channel CH2, the signal pad Q3 is electrically connected to the signal pad P3 through the signal channel CH3, and the rest is deduced by analogy.

In some embodiments, the signal pads P1-P100 are arranged to form a rectangle. In further embodiments, the signal pads P1-P100 are evenly disposed on four sides of the rectangle. For illustration, the signal pads P1-P25 are disposed at one side of the rectangle, and the signal pads P26-P50 are disposed at another side of the rectangle, and the rest is deduced by analogy.

In some embodiments, the signal pads P1-P100 are configured to be electrically connected to all of the testing signal output ends of the testing signal output port 14 of the tester 10. For illustration, in some embodiments, the tester 10 is the Agilent MPTT tester having 100 testing signal output ends. The signal pads Q1-Q100 are configured to be electrically connected 1-to-1 to all of the testing signal output ends of the Agilent MPTT tester.

In such a configuration, the PCB 62 is able to receive all of various kinds of testing signals generated by the tester 10, and to provide the received testing signals to different kinds of the DUT 70/70a with different designs via the membrane core 64.

Figure 3:
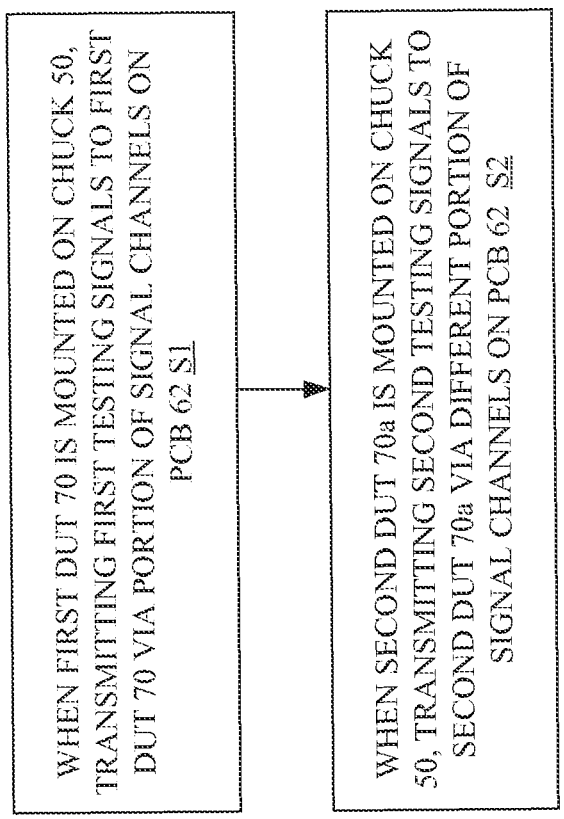
FIG. 3 is a flow chart of an application method of the PCB in FIG. 2, in accordance with some embodiments.

For illustration, an operative example is provided with reference to FIG. 3.

FIG. 3 is a flow chart of an application method 300 of the PCB 62 in FIG. 2, in accordance with some embodiments.

In operation 51, in a case that a first DUT 70 with a first design is mounted on the chuck 50, first testing signals are generated by the tester 10, and are transmitted to the first DUT 70 via a portion of the signal channels CH1-100 on the PCB 62 and the membrane core 64. For illustration, the first testing signals are transmitted to the first DUT 70 via the signal channels CH12-CH22 and CH62-CH72.

In operation S2, in a case that a second DUT 70a with a second design different from the first design is mounted on the chuck 50, second testing signals are generated by the tester 10, and are transmitted to the second DUT 70a via a different portion of the signal channels CH1-100 on the PCB 62 and the membrane core 64. For illustration, the first testing signals are transmitted via the signal channels CH5-CH25, CH31-CH41 and CH62-CH72.

Explained in a different way, in an application of the PCB 62, at least partly different portions of the signal channels CH1-100 of the PCB 62 are selectively used to transmit the first testing signals and the second testing signals.

The quantity of the signal channels receiving the first testing signals is different from the quantity of the signal channels receiving the second testing signals in the embodiments illustrated above, and it is given for illustrative purposes. In various embodiments, the quantity of the signal channels receiving the first testing signals is identical to the quantity of the signal channels receiving the second testing signals.

The signal channels that receive the first testing signals and second testing signals described above are given for illustrative purposes. Various signal channels are within the contemplated scope of the present disclosure.

In some approaches, a specific PCB of a probe card for probing a DUT is designed corresponding to a specific design of the DUT. A different PCB with a different design is required for probing a different DUT. Thus, considerable time and cost spent on designing and manufacturing various kinds of PCBs for various kinds of DUT are needed.

Compared with the preceding approaches, in the present disclosure, the PCB 62 of the probe card 60 is able to selectively transmit various kinds of testing signals via different sets of the signal channels CH1-CH100. Hence, the PCB 62 is able to be used for probing different kinds of the DUT 70/70a with different designs. Thus, time and cost spent on designing and manufacturing various kinds of PCBs for various kinds of DUT in the preceding approaches can be saved.

In some embodiments, the ground pads G1-G100 are disposed adjacent to the signal pads P1-P100 respectively (as shown in FIG. 2). All of the ground pads G1-G100 are configured to be electrically connected to the ground, so as to reduce noise of the testing signals transmitting through the signal pads P1-P100 respectively.

In some embodiments, the ground pads G1-G100 are disposed around the signal pads P1-P100. In some embodiments, the ground pads G1-G100 are disposed at an outer side of the signal pads P1-P100, where the signal pads Q1-Q100 are termed as being disposed at an inner side of the signal pads P1-P100.

In some embodiments, the ground pads G1-G100 are arranged in a rectangle outside a rectangle in which the signal pads P1-P100 are arranged. In further embodiments, the ground pads G1-G100 are evenly disposed at four sides of the rectangle in which the ground pads G1-G100 are arranged. For illustration, the ground pads G1-G25 are disposed at one side of the rectangle in which the ground pads G1-G100 are arranged, and the ground pads G26-G50 are disposed at another side of the rectangle in which the ground pads G1-G100 are arranged.

In various embodiments, the ground pads G1-G100 are arranged in a circle or a diamond corresponding to the arrangement of the signal pads P1-P100.

The ground pads G1-G100 in FIG. 2 are given for illustrative purposes. Various numbers and configurations of the ground pads G1-G100 are within the contemplated scope of the present disclosure.

In some embodiments, a probe card PCB is disclosed that includes a plurality of first signal pads, a plurality of signal channels, and a plurality of second signal pads. The first signal pads are adjacently disposed to define an opening. At least one of the first signal pads is configured to be electrically connected to at least one of signal traces of a membrane core inserted into the opening. All of the signal channels are electrically connected to all of the first signal pads respectively. All of the second signal pads are electrically connected to all of the signal channels respectively.

Also disclosed is a probe card PCB that includes four pad assemblies, a plurality of second signal pads, and a plurality of signal channels. The four pad assemblies are adjacently disposed to define a rectangular opening. Each of pad assemblies includes a plurality of first signal pads. At least one of the first signal pads of the four pad assemblies is configured to be electrically connected to at least one of signal traces of a membrane core inserted into the opening. The signal channels are configured to electrically connect the first signal pads of the four pad assemblies and the second signal pads, to make the first signal pads of the four pad assemblies be connected 1-to-1 to the second signal pads.

Also disclosed is a method that includes selectively transmitting first testing signals to a membrane core through a portion of a plurality of signal channels on a printed circuit board (PCB), and transmitting second testing signals to the membrane core through a portion of the signal channels on the PCB. The signal channels through which the first testing signals are transmitted are different from the signal channels through which the second testing signals are transmitted.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a plurality of first signal pads adjacently disposed to define an opening, wherein at least one of the first signal pads is configured to be electrically connected to at least one of signal traces of a membrane core inserted into the opening;
    a plurality of signal channels, wherein all of the signal channels are electrically connected to all of the first signal pads respectively; and
    a plurality of second signal pads, wherein all of the second signal pads are electrically connected to all of the signal channels respectively.

2. The device as claimed in claim 1, wherein the second signal pads are configured to be electrically connected to all of test signal output ends of a tester respectively.

3. The device as claimed in claim 1 further comprising at least one ground pad, wherein the ground pad is electrically connected to the ground, and is disposed adjacent to one of the second signal pads.

4. The device as claimed in claim 3, wherein the ground pad is disposed at an outer side of the second signal pads, and the first signal pads are disposed at an inner side of the second signal pads.

5. The device as claimed in claim 1 further comprising a plurality of ground pads, wherein the ground pads are disposed adjacent to the second signal pads respectively.

6. The device as claimed in claim 5 wherein the ground pads are arranged in a rectangle outside a rectangle arranged by the second signal pads.

7. The device as claimed in claim 6 wherein the second signal pads are evenly disposed at four sides of the rectangle arranged by the second signal pads.

8. A device comprising:
    four pad assemblies adjacently disposed to define a rectangular opening, wherein each of pad assemblies comprises a plurality of first signal pads, at least one of the first signal pads of the four pad assemblies is configured to be electrically connected to at least one of signal traces of a membrane core inserted into the opening;
    a plurality of second signal pads; and
    a plurality of signal channels electrically connected to the first signal pads of the four pad assemblies and the second signal pads, to make the first signal pads of the four pad assemblies be electrically connected 1-to-1 to the second signal pads.

9. The device as claimed in claim 8, wherein the second signal pads are configured to be electrically connected to all of test signal output ends of a tester respectively.

10. The device as claimed in claim 8, wherein quantities of the first signal pads in each of the pad assemblies are substantially identical.

11. The device as claimed in claim 8 further comprising at least one ground pad, wherein the ground pad is electrically connected to the ground, and is disposed adjacent to one of the second signal pads.

12. The device as claimed in claim 11, wherein the ground pad is disposed at an outer side of the second signal pads, and the first signal pads of the four pad assemblies are disposed at an inner side of the second signal pads.

13. The device as claimed in claim 8 further comprising a plurality of ground pads, wherein the ground pads are disposed adjacent to the second signal pads respectively.

14. The device as claimed in claim 13 wherein the ground pads are arranged in a rectangle outside a rectangle arranged by the second signal pads.

15. The device as claimed in claim 14 wherein the second signal pads are evenly disposed at four sides of the rectangle arranged by the second signal pads.

16. A method comprising:
    selectively transmitting first testing signals to a membrane core through a portion of a plurality of signal channels on a printed circuit board (PCB), and transmitting second testing signals to the membrane core through a portion of the signal channels on the PCB, wherein the signal channels through which the first testing signals are transmitted are different from the signal channels through which the second testing signals are transmitted, wherein the membrane core is inserted into an opening defined by a plurality of first signal pads on the PCB.

17. The method as claimed in claim 16, wherein a quantity of the signal channels which the first testing signals transmitted through is different from a quantity of the signal channels which the second testing signals transmitted through.

18. The method as claimed in claim 16, wherein selectively transmitting the first testing signals to the membrane core or transmitting the second testing signals to the membrane core comprises:

selectively transmitting the first testing signals to the membrane core through a portion of the first signal pads, wherein the portion of the first signal pads are electrically connected to the signal channels which the first testing signals transmitted through, the first signal pads are adjacently disposed to define the opening, and the membrane core is electrically connected to the first signal pads.

19. The method as claimed in claim 16, wherein selectively transmitting the first testing signals to the membrane core or transmitting the second testing signals to the membrane core comprises:

selectively transmitting the first testing signals to the membrane core through a portion of a plurality of second signal pads, wherein the portion of the second signal pads are electrically connected to the signal channels which the first testing signals transmitted through, the second signal pads are configured to be electrically connected all of test signal output ends of a tester respectively.

20. The method as claimed in claim 19, further comprising:

reducing, through a plurality of ground pads, noise of the first testing signal, wherein the ground pads are electrically connected to the ground and disposed adjacent to the portion of the second signal pads.

\* \* \* \* \*